United States Patent
Lu et al.

(10) Patent No.: US 9,711,411 B2
(45) Date of Patent: Jul. 18, 2017

(54) SEMICONDUCTOR DEVICE AND METHOD FOR FABRICATING THE SAME

(71) Applicant: UNITED MICROELECTRONICS CORP., Hsin-Chu (TW)

(72) Inventors: Chia-Lin Lu, Taoyuan (TW); Shih-Fang Tzou, Tainan (TW); Chun-Lung Chen, Tainan (TW); Kun-Yuan Liao, Hsin-Chu (TW); Feng-Yi Chang, Tainan (TW); Wei-Hao Huang, New Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/963,216

(22) Filed: Dec. 8, 2015

(65) Prior Publication Data
US 2017/0133274 A1 May 11, 2017

(30) Foreign Application Priority Data
Nov. 10, 2015 (CN) .......................... 2015 1 0759984

(51) Int. Cl.
*H01L 21/8234* (2006.01)
*H01L 27/092* (2006.01)
*H01L 21/02* (2006.01)
*H01L 21/311* (2006.01)
*H01L 21/768* (2006.01)

(52) U.S. Cl.
CPC .............. *H01L 21/823431* (2013.01); *H01L 21/02164* (2013.01); *H01L 21/02167* (2013.01); *H01L 21/31116* (2013.01); *H01L 21/76897* (2013.01); *H01L 27/0924* (2013.01)

(58) Field of Classification Search
CPC ......... H01L 21/76831; H01L 21/79834; H01L 21/76829; H01L 21/823821; H01L 21/845; H01L 27/10879; H01L 27/0886; H01L 29/41791; H01L 2029/7858
See application file for complete search history.

(56) References Cited

U.S. PATENT DOCUMENTS

| 5,960,270 | A  * | 9/1999  | Misra    | H01L 21/2257  |
|           |      |         |          | 257/E21.151   |
| 6,531,724 | B1 * | 3/2003  | Furukawa | H01L 21/76888 |
|           |      |         |          | 257/288       |
| 6,613,624 | B2 * | 9/2003  | Wurzer   | H01L 21/82342 |
|           |      |         |          | 257/E21.62    |
| 6,878,597 | B2 * | 4/2005  | Kim      | H01L 29/6659  |
|           |      |         |          | 257/384       |
| 7,314,793 | B2 * | 1/2008  | Frohberg | H01L 21/823807|
|           |      |         |          | 257/E21.315   |
| 7,615,426 | B2 * | 11/2009 | Wang     | H01L 29/165   |
|           |      |         |          | 257/336       |

(Continued)

OTHER PUBLICATIONS

Tsai, Title of Invention: Semiconductor Device and Method for Fabricating the Same, U.S. Appl. No. 14/940,120, filed Nov. 12, 2015.

*Primary Examiner* — Earl Taylor
(74) *Attorney, Agent, or Firm* — Winston Hsu

(57) ABSTRACT

A method for fabricating semiconductor device is disclosed. The method includes the steps of: providing a substrate; forming a first gate structure and a second gate structure on the substrate; forming a contact etch stop layer (CESL) on the first gate structure, the second gate structure, and the substrate; removing part of the CESL between the first gate structure and the second gate structure; and forming an interlayer dielectric (ILD) layer on the CESL.

15 Claims, 3 Drawing Sheets

(56) References Cited

U.S. PATENT DOCUMENTS

| | | | | |
|---|---|---|---|---|
| 8,084,311 B1* | 12/2011 | Horak | H01L 21/76897 | 438/183 |
| 8,202,776 B2* | 6/2012 | Chang | H01L 21/28247 | 438/216 |
| 8,389,371 B2* | 3/2013 | Wang | H01L 29/66545 | 257/390 |
| 8,735,269 B1* | 5/2014 | Sun | H01L 21/28088 | 438/592 |
| 8,822,298 B2* | 9/2014 | Flachowsky | H01L 21/823425 | 257/288 |
| 8,940,633 B2* | 1/2015 | Cai | H01L 29/401 | 438/608 |
| 8,975,673 B2* | 3/2015 | Chou | H01L 29/4983 | 257/213 |
| 8,999,834 B2* | 4/2015 | Chung | H01L 21/76829 | 438/595 |
| 9,006,058 B1* | 4/2015 | Chen | H01L 21/823814 | 438/230 |
| 9,117,904 B2* | 8/2015 | Chou | H01L 29/4983 | |
| 9,159,794 B2* | 10/2015 | Yu | H01L 29/401 | |
| 9,209,272 B2* | 12/2015 | Liu | H01L 29/66545 | |
| 9,218,974 B2* | 12/2015 | Chung | | |
| 9,230,864 B1* | 1/2016 | Lu | H01L 29/7831 | |
| 9,252,273 B2* | 2/2016 | Zang | H01L 29/41775 | |
| 9,287,139 B2* | 3/2016 | Hsiao | H01L 21/324 | |
| 9,312,354 B2* | 4/2016 | Liu | H01L 29/49 | |
| 9,318,389 B1* | 4/2016 | Yang | H01L 21/82345 | |
| 9,330,920 B1* | 5/2016 | Chen | H01L 21/28008 | |
| 9,379,242 B1* | 6/2016 | Lin | H01L 29/7847 | |
| 9,384,988 B2* | 7/2016 | Lin | H01L 21/28247 | |
| 9,396,953 B2* | 7/2016 | Hung | H01L 21/2855 | |
| 2002/0058402 A1 | 5/2002 | Wieczorek | H01L 21/28518 | 438/586 |
| 2004/0212095 A1* | 10/2004 | Ferreira | H01L 21/0337 | 257/774 |
| 2005/0040479 A1* | 2/2005 | Koldiaev | H01L 21/3144 | 257/411 |
| 2006/0009030 A1* | 1/2006 | Griffin | H01L 21/02063 | 438/637 |
| 2006/0189053 A1* | 8/2006 | Wang | H01L 29/165 | 438/197 |
| 2007/0023822 A1* | 2/2007 | Sung | H01L 29/42324 | 257/316 |
| 2007/0210421 A1* | 9/2007 | Bu | H01L 21/3105 | 257/635 |
| 2008/0064176 A1* | 3/2008 | Chou | H01L 29/6653 | 438/303 |
| 2008/0157208 A1* | 7/2008 | Fischer | H01L 21/76843 | 257/368 |
| 2008/0248649 A1* | 10/2008 | Adetutu | H01L 21/02164 | 438/692 |
| 2008/0272492 A1* | 11/2008 | Tsang | H01L 21/7682 | 257/758 |
| 2009/0057769 A1* | 3/2009 | Wei | H01L 21/82345 | 257/369 |
| 2009/0104741 A1* | 4/2009 | Shin | H01L 21/28176 | 438/229 |
| 2009/0140313 A1* | 6/2009 | Joo | H01L 27/115 | 257/314 |
| 2010/0001369 A1* | 1/2010 | Chuang | H01L 21/8249 | 257/526 |
| 2010/0022061 A1* | 1/2010 | Wu | H01L 21/823468 | 438/301 |
| 2010/0059833 A1* | 3/2010 | Yu | H01L 21/823807 | 257/410 |
| 2010/0062592 A1* | 3/2010 | Clark | H01L 21/28176 | 438/591 |
| 2010/0270627 A1* | 10/2010 | Chang | H01L 21/28247 | 257/411 |
| 2010/0301427 A1* | 12/2010 | Lenski | H01L 21/28088 | 257/392 |
| 2010/0311231 A1* | 12/2010 | Thei | H01L 21/823842 | 438/587 |
| 2010/0314690 A1* | 12/2010 | Chung | H01L 21/76829 | 257/384 |
| 2011/0024805 A1* | 2/2011 | Kammler | H01L 21/823807 | 257/288 |
| 2011/0108994 A1* | 5/2011 | Liang | H01L 21/3212 | 257/774 |
| 2011/0151635 A1* | 6/2011 | Liu | H01L 21/28518 | 438/301 |
| 2011/0156107 A1* | 6/2011 | Bohr | H01L 21/76831 | 257/288 |
| 2012/0032238 A1* | 2/2012 | Teo | H01L 21/28518 | 257/288 |
| 2012/0032268 A1* | 2/2012 | Hou | H01L 21/76816 | 257/368 |
| 2012/0070948 A1* | 3/2012 | Cheng | H01L 21/823425 | 438/199 |
| 2012/0156855 A1* | 6/2012 | Sim | H01L 21/76229 | 438/421 |
| 2012/0235215 A1* | 9/2012 | Flachowsky | H01L 21/823425 | 257/288 |
| 2012/0315760 A1* | 12/2012 | Yu | H01L 21/823807 | 438/682 |
| 2013/0043539 A1* | 2/2013 | Chang | H01L 21/823807 | 257/369 |
| 2013/0049132 A1* | 2/2013 | Doris | H01L 21/7682 | 257/383 |
| 2013/0065371 A1* | 3/2013 | Wei | H01L 21/76224 | 438/294 |
| 2013/0105912 A1* | 5/2013 | Hsu | H01L 27/0629 | 257/379 |
| 2013/0157450 A1* | 6/2013 | Fitz | H01L 21/76897 | 438/586 |
| 2013/0175629 A1* | 7/2013 | Chang | H01L 21/823475 | 257/368 |
| 2013/0270613 A1* | 10/2013 | Chou | H01L 29/4983 | 257/288 |
| 2013/0270651 A1* | 10/2013 | Chung | H01L 21/76829 | 257/384 |
| 2014/0015104 A1* | 1/2014 | Su | H01L 21/225 | 257/611 |
| 2014/0042549 A1* | 2/2014 | Von Kluge | H01L 21/823807 | 257/369 |
| 2014/0106558 A1* | 4/2014 | Hsu | H01L 21/28123 | 438/595 |
| 2014/0170846 A1* | 6/2014 | Chung | H01L 21/76829 | 438/595 |
| 2014/0252424 A1* | 9/2014 | Cai | H01L 29/401 | 257/288 |
| 2014/0361352 A1* | 12/2014 | Hung | H01L 21/28008 | 257/288 |
| 2015/0072511 A1* | 3/2015 | Liu | H01L 29/66545 | 438/586 |
| 2015/0129939 A1* | 5/2015 | Alptekin | H01L 29/66545 | 257/288 |
| 2015/0137195 A1* | 5/2015 | Lin | H01L 21/28247 | 257/288 |
| 2015/0137197 A1* | 5/2015 | Chou | H01L 29/4983 | 257/288 |
| 2015/0137234 A1* | 5/2015 | Cheng | H01L 21/7624 | 257/347 |
| 2015/0194517 A1* | 7/2015 | Zang | H01L 29/41775 | 257/412 |
| 2015/0200260 A1* | 7/2015 | Yu | H01L 29/401 | 438/509 |
| 2015/0228546 A1* | 8/2015 | Huang | H01L 21/823864 | 257/369 |
| 2015/0228646 A1* | 8/2015 | Ho | H01L 27/088 | 257/392 |
| 2015/0243526 A1* | 8/2015 | Hsiao | H01L 21/324 | 438/289 |
| 2015/0243751 A1* | 8/2015 | Liu | H01L 29/49 | 257/288 |
| 2015/0255556 A1* | 9/2015 | Cheng | H01L 29/7813 | 257/332 |

(56) References Cited

U.S. PATENT DOCUMENTS

| | | | | |
|---|---|---|---|---|
| 2015/0262822 A1* | 9/2015 | Hung | H01L 21/28088 | 257/412 |
| 2015/0262823 A1* | 9/2015 | Hung | H01L 21/2855 | 257/368 |
| 2015/0279838 A1* | 10/2015 | Tsao | H01L 29/66553 | 257/383 |
| 2015/0364573 A1* | 12/2015 | Yeh | H01L 29/66545 | 438/595 |
| 2015/0372108 A1* | 12/2015 | Cai | H01L 29/6656 | 257/401 |
| 2015/0380406 A1* | 12/2015 | Chang | H01L 27/0922 | 257/369 |
| 2015/0380502 A1* | 12/2015 | Yu | H01L 29/401 | 257/192 |
| 2015/0380558 A1* | 12/2015 | Huang | H01L 29/66795 | 257/288 |
| 2016/0005650 A1* | 1/2016 | Yang | H01L 21/76895 | 257/288 |
| 2016/0005731 A1* | 1/2016 | Chen | H01L 27/0629 | 257/300 |
| 2016/0013288 A1* | 1/2016 | Cheng | H01L 29/4966 | 438/592 |
| 2016/0020300 A1* | 1/2016 | Tsai | H01L 29/66636 | 438/299 |
| 2016/0049514 A1* | 2/2016 | Zang | H01L 29/41775 | 257/401 |
| 2016/0064518 A1* | 3/2016 | Liu | H01L 29/66545 | 438/586 |
| 2016/0064528 A1* | 3/2016 | Lu | H01L 29/66795 | 257/288 |
| 2016/0087037 A1* | 3/2016 | Cheng | H01L 29/0847 | 257/392 |
| 2016/0093536 A1* | 3/2016 | Yang | H01L 21/82345 | 257/392 |
| 2016/0093616 A1* | 3/2016 | Lai | H01L 21/28088 | 257/369 |
| 2016/0099337 A1* | 4/2016 | Cheng | H01L 29/66545 | 438/585 |
| 2016/0104786 A1* | 4/2016 | Yang | H01L 29/4966 | 257/369 |
| 2016/0111541 A1* | 4/2016 | Chang | H01L 29/7851 | 257/288 |
| 2016/0163815 A1* | 6/2016 | Hoentschel | H01L 29/665 | 257/379 |
| 2016/0190019 A1* | 6/2016 | Yang | H01L 21/823842 | 438/592 |
| 2016/0204026 A1* | 7/2016 | Liu | H01L 21/76877 | 438/666 |

* cited by examiner

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly, to a method of removing part of contact etch stop layer (CESL) between two gate structures before formation of an interlayer dielectric (ILD) layer.

2. Description of the Prior Art

In current semiconductor industry, polysilicon has been widely used as a gap-filling material for fabricating gate electrode of metal-oxide-semiconductor (MOS) transistors. However, the conventional polysilicon gate also faced problems such as inferior performance due to boron penetration and unavoidable depletion effect which increases equivalent thickness of gate dielectric layer, reduces gate capacitance, and worsens driving force of the devices. In replacing polysilicon gates, work function metals have been developed to serve as a control electrode working in conjunction with high-K gate dielectric layers.

However, in current fabrication of high-k metal transistor, an extra step is often required to remove part of the CESL during formation of contact plugs, resulting in increase in cost. Hence, how to resolve this issue has become an important task in this field.

SUMMARY OF THE INVENTION

According to a preferred embodiment of the present invention, a method for fabricating semiconductor device is disclosed. The method includes the steps of: providing a substrate; forming a first gate structure and a second gate structure on the substrate; forming a contact etch stop layer (CESL) on the first gate structure, the second gate structure, and the substrate; removing part of the CESL between the first gate structure and the second gate structure; and forming an interlayer dielectric (ILD) layer on the CESL.

According to another aspect of the present invention, a semiconductor device is disclosed. The semiconductor device includes: a substrate; a first gate structure on the substrate; a first contact etch stop layer (CESL) adjacent to the sidewall of the first gate structure, wherein the first CESL is L-shaped; and an interlayer dielectric (ILD) layer on the substrate and contacting the CESL and the substrate.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
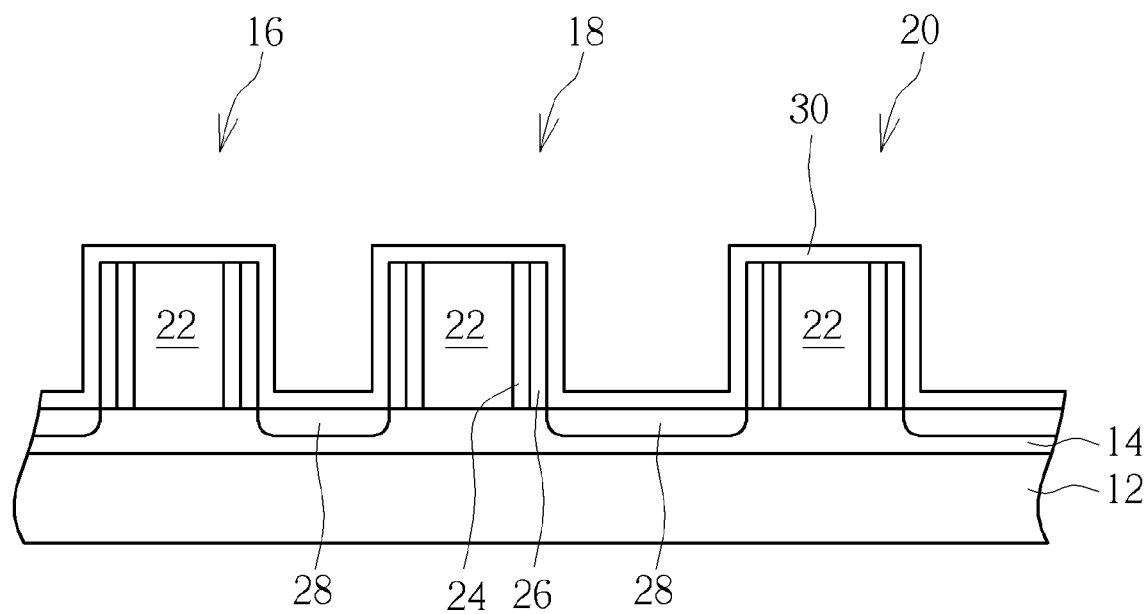
FIGS. 1-6 illustrate a method for fabricating semiconductor device according to a preferred embodiment of the present invention.

Referring to FIGS. 1-6, FIGS. 1-6 illustrate a method for fabricating semiconductor device according to a preferred embodiment of the present invention. As shown in FIG. 1, a substrate 12, such as a silicon substrate or silicon-on-insulator (SOI) substrate is provided, and a transistor region, such as a PMOS region or a NMOS region is defined on the substrate 12. At least a fin-shaped structure 14 and an insulating layer (not shown) are formed on the substrate 12, in which the bottom of the fin-shapes structure 14 is preferably enclosed by the insulating layer, such as silicon oxide to form a shallow trench isolation (STI), and a plurality of gate structures 16, 18, 20 are formed on part of the fin-shaped structure 14. It should be noted that even though three gate structures are disclosed in this embodiment, the quantity of the gate structures is not limited to three, but could by any quantity depending on the demand of the product.

The formation of the fin-shaped structure 14 could be accomplished by first forming a patterned mask (now shown) on the substrate, 12, and an etching process is performed to transfer the pattern of the patterned mask to the substrate 12. Next, depending on the structural difference of a tri-gate transistor or dual-gate fin-shaped transistor being fabricated, the patterned mask could be stripped selectively or retained, and deposition, chemical mechanical polishing (CMP), and etching back processes are carried out to form a STI surrounding the bottom of the fin-shaped structure 14. Alternatively, the formation of the fin-shaped structure 14 could be accomplished by first forming a patterned hard mask (not shown) on the substrate 12, and then performing an epitaxial process on the exposed substrate 12 through the patterned hard mask to grow a semiconductor layer. This semiconductor layer could then be used as the corresponding fin-shaped structure 14. Similarly, the patterned hard mask could be removed selectively or retained, and deposition, CMP, and then etching back could be used to form a STI surrounding the bottom of the fin-shaped structure 14. Moreover, if the substrate 12 were a SOI substrate, a patterned mask could be used to etch a semiconductor layer on the substrate until reaching a bottom oxide layer underneath the semiconductor layer to form the corresponding fin-shaped structure. If this means is chosen the aforementioned steps for fabricating the STI could be eliminated.

The fabrication of the gate structures 16, 18, 20 could be accomplished by a gate first process, a high-k first approach from gate last process, or a high-k last approach from gate last process. Since this embodiment pertains to a high-k last approach, gate structures 16, 18, 20 containing interfacial layer (not shown) and gate electrodes composed of polysilicon material 22 could be first formed on the fin-shaped structure 14, and spacers 24 and 26 are formed adjacent to each of the gate structures 16, 18, 20.

In this embodiment, the spacer 24 is composed of SiCN and the spacer 26 formed around the spacer 24 is preferably composed of $SiO_2$, but not limited thereto. For instance, the spacers 24 and 26 could be selected from the group consisting of $SiO_2$, SiN, SiON, and SiCN while the spacers 24 and 26 are preferably composed of different material.

Next, a source/drain region 28 and/or epitaxial layer (not shown) formed in the fin-shaped structure 14 and/or substrate 12 adjacent to two sides of the spacers 24 and 26, and a silicide (not shown) is selectively formed on the surface of the source/drain region 28 and/or epitaxial layer. A CESL 30 is then deposited on the gate structures 16, 18, 20 and substrate 12, in which the CESL 30 is preferably composed of SiCN, but could also be composed of other stress material such as SiN.

Figure 2:
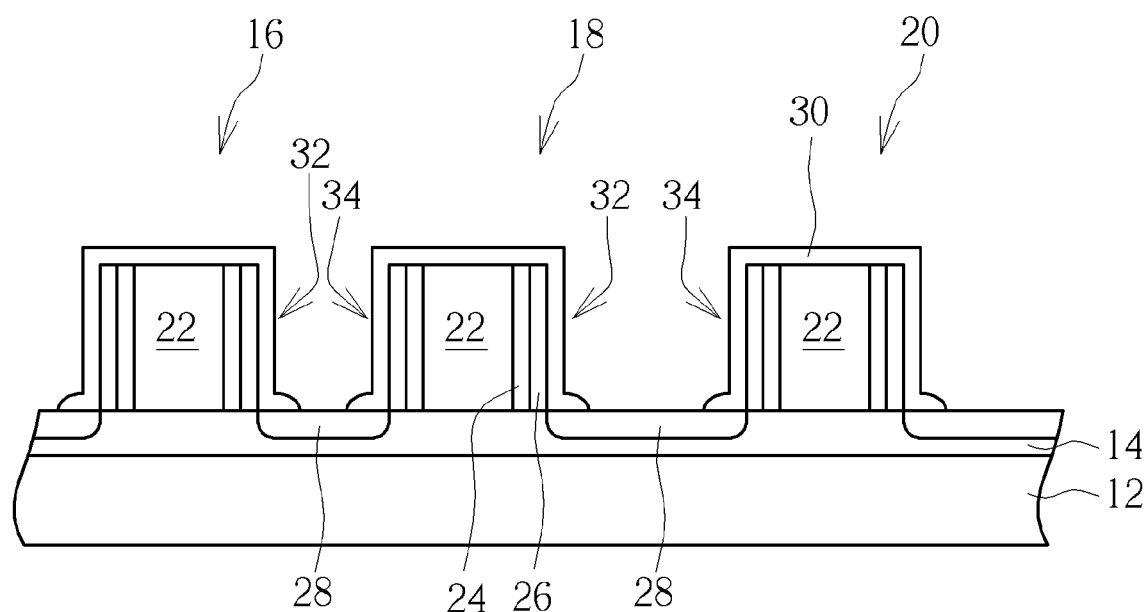

Next, as shown in FIG. 2, an etching process is conducted to remove part of the CESL 30 between gate structures 16 and 18 and part of the CESL 30 between gate structures 18 and 20. This exposes the surface of the fin-shaped structures 14 and forms a L-shaped CESL 32 adjacent to a sidewall of each of the gate structures 16, 18, 20 or spacers 24, 26 and a reverse L-shaped CESL 34 adjacent to another sidewall of the gate structures 16, 18, 20 or spacers 24, 26. According to an embodiment of the present invention, an optional thermal treatment could be conducted to keep the stress of the CESL 30 before the CESL 30 is separated It should be noted that even though a height difference is observed between the CESL 30 directly on top of the gate structures 16, 18, 20 and the CESL 30 on the surface of the fin-shaped structure 14, it would be desirable to separate the CESL 30 directly on top of the gate structures 16, 18, 20 while separating the CESL 30 between gate structures 16, 18, 20, or keep the CESL 30 directly on top of the gate structures 16, 18, 20 intact while the CESL 30 between gate structures 16, 18, 20 is separated.

For instance, if no mask were used during the aforementioned etching process, it would be desirable to remove the CESL 30 directly on top of the gate structures 16, 18, 20 and expose the polysilicon material 22 surface while part of the CESL 30 between gate structures 16, 18, 20 is removed. If the CESL 30 directly on top of the gate structures 16, 18, 20 were to be kept intact, according to an embodiment of the present invention, it would be desirable to first conduct a deposition process to form a polymer (not shown) on the CESL 30 that was directly on top of the gate structures 16, 18, 20, and then perform the aforementioned etching process by using the polymer as mask to remove the CESL 30 between gate structures 16, 18, 20. Through the protection of the polymer, the thickness of the CESL 30 directly on top of the gate structures 30 could be maintained throughout the etching process. In this embodiment, the etching gas used for removing the CESL 30 could be selected from the group consisting of $CH_2F_2$, $CH_3F$, and $CF_4$, but not limited thereto.

Figure 3:
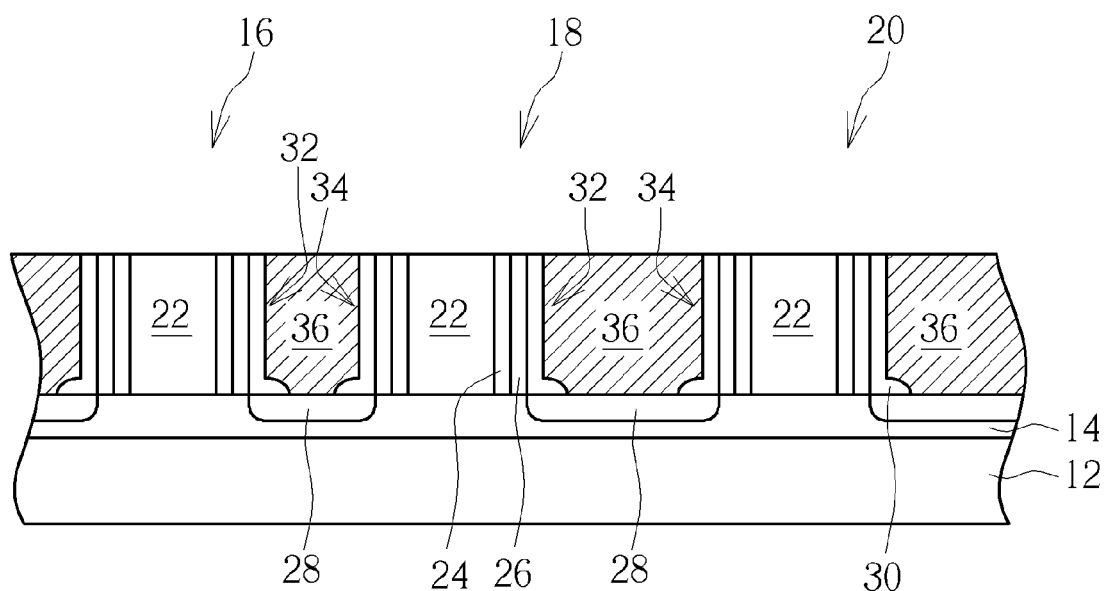

Next, as shown in FIG. 3, an interlayer dielectric (ILD) layer 36 is formed on the CESL 30 and fin-shaped structure 14 while filling the space between gate structures 16, 18, 20, and a planarizing process, such as CMP is conducted to remove part of ILD layer 36 and part of the CESL 30 so that the gate electrode composed of polysilicon material 22 is exposed and the top surfaces of the gate electrode and the ILD layer 36 are coplanar.

Figure 4:
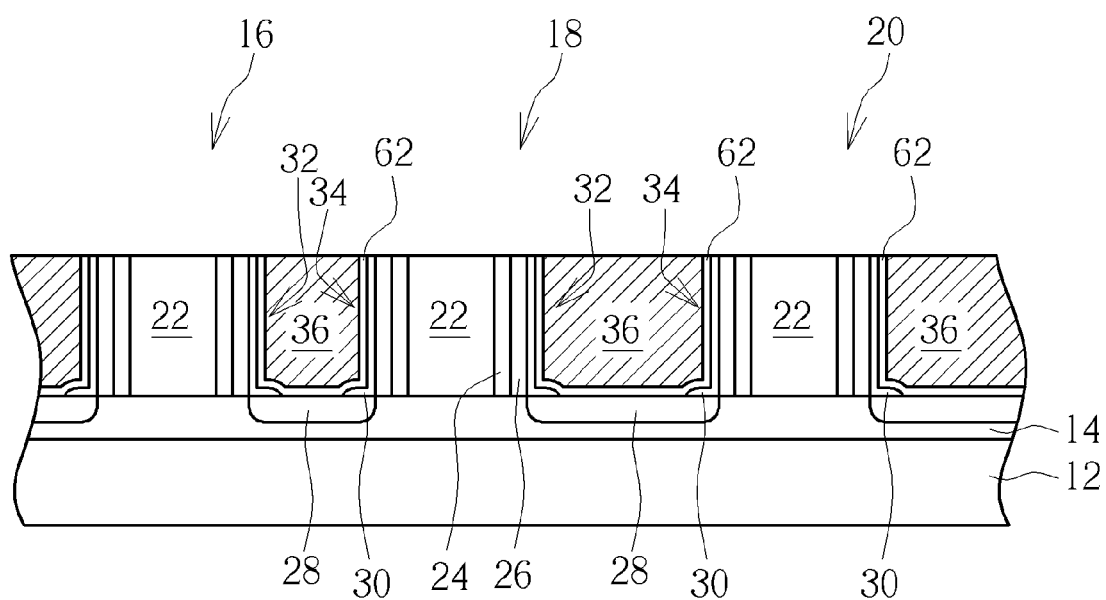

According to an embodiment of the present invention, as shown in FIG. 4, instead of forming the ILD layer 36 immediately after separating the single layered CESL 30 as revealed in the embodiment shown in FIG. 3, it would also be desirable to form another CESL 62 on the CESL 30 after the CESL 30 is separated and before the ILD layer 36 is formed. The ILD layer 36 is then deposited on the second CESL 62 as the CESL 62 is not etched or separated, which is also within the scope of the present invention.

Figure 5:
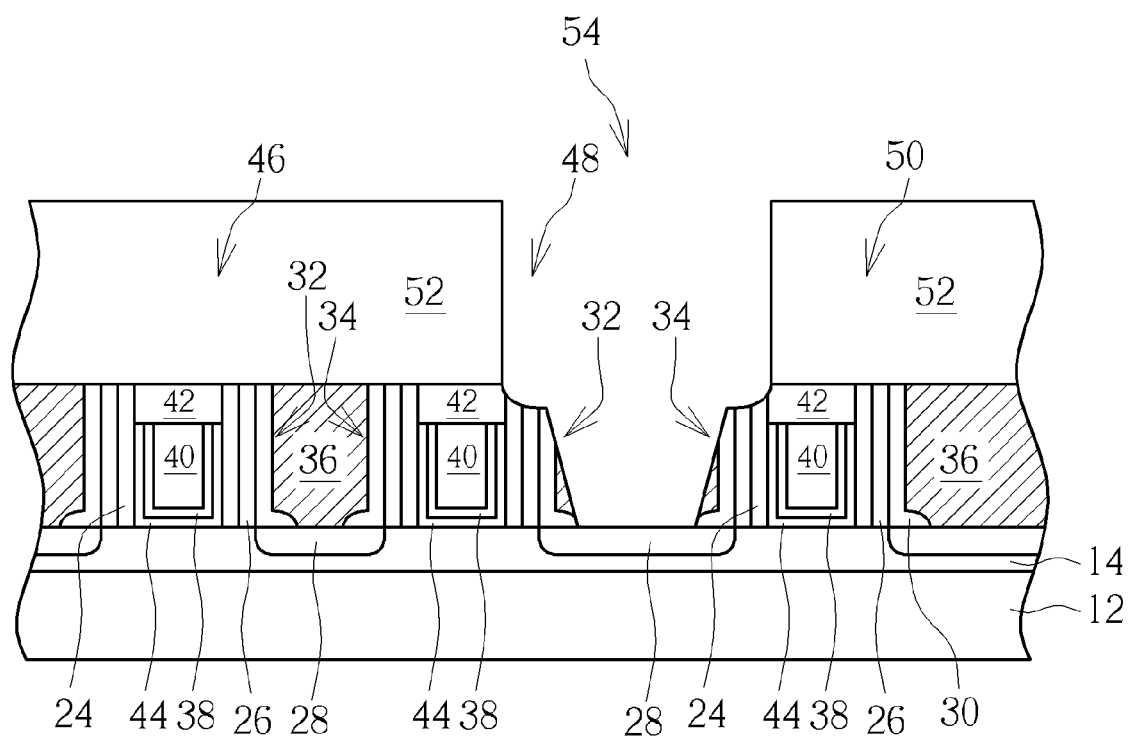

Next as shown in FIG. 5, a replacement metal gate (RMG) process is conducted to transform the gate structures 16, 18, 20, into metal gates 46, 48, 50. The RMG process could be accomplished by first performing a selective dry etching or wet etching process by using etchants including ammonium hydroxide ($NH_4OH$) or tetramethylammonium hydroxide (TMAH) to remove the polysilicon material 22 from gate structures 16, 18, 20 for forming recesses (not shown) in the ILD layer 36. Next, a high-k dielectric layer 44 and a conductive layer including at least a U-shaped work function metal layer 38 and a low resistance metal layer 40 are formed in the recesses, and a planarizing process is conducted so that the surfaces of the U-shaped high-k dielectric layer 44, the U-shaped work function layer 38 and low resistance metal layer 40 are even with the surface of the ILD layer 36.

In this embodiment, the high-k dielectric layer 44 is preferably selected from dielectric materials having dielectric constant (k value) larger than 4. For instance, the high-k dielectric layer 44 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the work function metal layer 38 is formed for tuning the work function of the later formed metal gates to be appropriate in an NMOS or a PMOS. For an NMOS transistor, the work function metal layer 38 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 38 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 38 and the low resistance metal layer 40, in which the material of the barrier layer may include titanium (Ti), titanium nitride (TiN), tantalum (Ta) or tantalum nitride (TaN). Furthermore, the material of the low-resistance metal layer 40 may include copper (Cu), aluminum (Al), titanium aluminum (TiAl), cobalt tungsten phosphide (CoWP) or any combination thereof. Since the process of using RMG process to transform dummy gate into metal gate is well known to those skilled in the art, the details of which are not explained herein for the sake of brevity. Next, part of the high-k dielectric layer 44, part of the work function metal layer 38, and part of the low resistance metal layer 40 could be removed to form recesses (not shown), and a hard mask 42 is formed into each of the recess so that the top surface of the hard masks 42 and the ILD layer 36 are coplanar. Preferably, the hard mask 42 could be selected from the group consisting of $SiO_2$, SiN, SiON, and SiCN.

Next, a dielectric layer 52 is formed on the metal gates 46, 48, 50 and the ILD layer 36, in which the dielectric layer 52 and ILD layer 36 could be composed of same material or different material. For instance, the dielectric layer 52 could be selected from the group consisting of $SiO_2$, SiN, SiON, and SiCN. Next, a patterned mask (not shown) such as a patterned resist is formed on the dielectric layer 52, and an etching process is conducted by using the patterned mask to remove part of the dielectric layer 52 and part of the ILD layer 36 between metal gates 48 and 50 to form a contact hole 54 exposing the fin-shaped structures 14 underneath.

Figure 6:
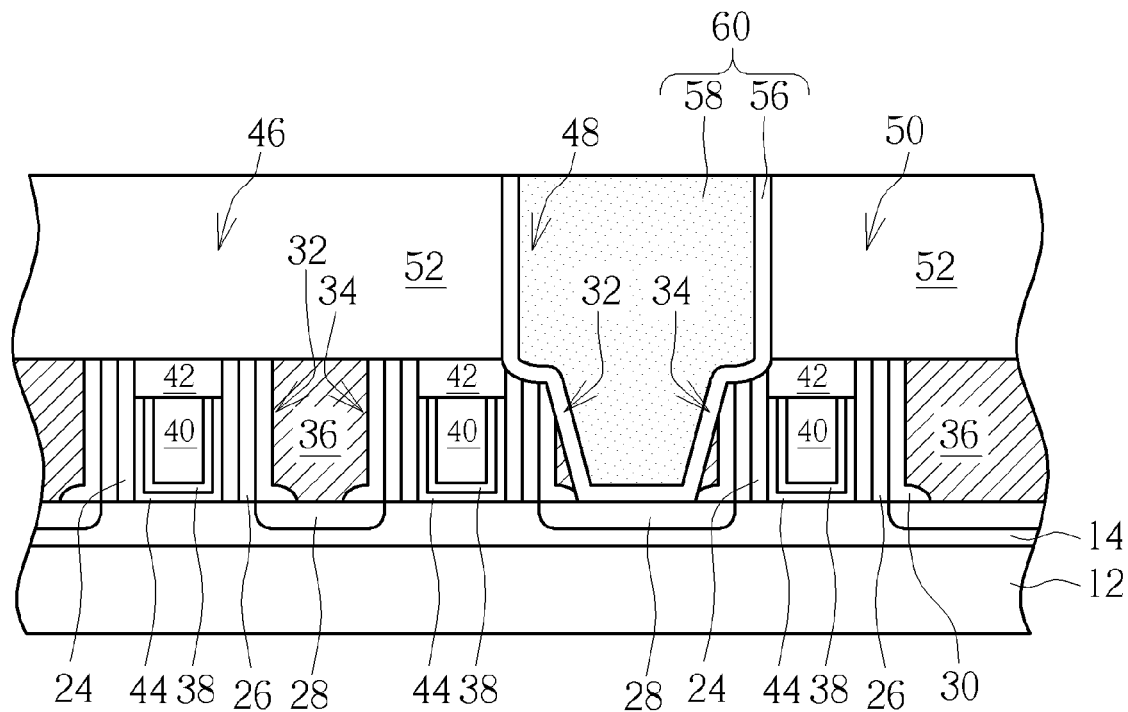

Next, as shown in FIG. 6, a contact plug formation is conducted by depositing metals into the contact hole 54, such as by sequentially forming a barrier layer 56 selected from the group consisting of Ti, TiN, Ta, and TaN and a metal layer 58 selected from the group consisting of W, Cu, Al, TiAl, and CoWP into the contact hole 54. After the barrier layer 56 and metal layer 58 are deposited, a planarizing process, such as CMP process is conducted to remove part of the barrier layer 56 and part of the metal layer 58 to form a contact plug 60 electrically connected to the source/drain region 28 and epitaxial layer in the substrate 12. It should be noted that even though the contact plug 60 in this embodiment directly contacts the adjacent ILD layer 36, it would also be desirable to remove all of the ILD layer 36 between metal gates 48 and 50 before contact hole 54 is formed, and if this approach were employed, the contact plug 60 formed afterwards would contact the CESLs 32 and 34 on the two sides directly, which is also within the scope of the present invention.

Referring again to FIG. 6, which further illustrates a structural view of a semiconductor device according to a preferred embodiment of the present invention. As shown in FIG. 6, the semiconductor device includes a substrate 12, gate structures or metal gates 46, 48, 50 on the substrate 12, spacer 24 and spacer 26 adjacent to each of the metal gates 46, 48, 50, CESLs 32 and 34 adjacent to the metal gates 46, 48, 50 or sidewalls of spacers 26, a ILD layer 36 on the substrate 12 and contacting the CESLs 32 and 34 and fin-shaped structure, a dielectric layer 52 on the metal gates 46, 48, 50 and ILD layer 36, and a contact plug 60 in the dielectric layer 52 and between metal gates 46, 48, 50 and contacting the source/drain region 28 in the substrate 12.

Specifically, each of the spacers 24 and 26 is I-shaped, the CESLs 32, 34 adjacent to the metal gates 46, 48, 50 or spacers 26 are L-shaped or reverse L-shaped, the spacer 24 is preferably composed of SiCN, the spacer 26 is composed of SiO$_2$, and the CESLs 32 and 34 are preferably composed of SiCN. Viewing at the ILD layer 36 between metal gates 46 and 48, the ILD layer 36 is on the substrate 12 and contacting the L-shaped CESL 32 adjacent to the metal gate 46, the reverse L-shaped CESL 34 adjacent to the metal gate 48, and fin-shaped structures 14 at the same time. In addition, the top surfaces and bottom surfaces of the spacers 24 and 26, the CESLs 32 and 34, and ILD layer 36 are coplanar.

If viewing at the contact plug 60 between metal gates 48 and 50, the contact plug 60 preferably contacts the ILD layer 36, CESLs 32 and 34, and fin-shaped structures 14 at the same time. However if the ILD layer 36 between metal gates 48 and 50 were removed completely during the formation of contact hole 54, the contact plug 60 would only be contacting the CESLs 32 and 34 and the fin-shaped structure 14 directly.

Overall, the present invention preferably uses an etching process to remove part of the CESL between gate structures and expose the fin-shaped structure or substrate underneath before an ILD layer is formed, and then forms the ILD layer on the gate structures and the CESL. Since the CESL is separated beforehand, no extra process is required to remove the CESL for forming contact hole and contact plug in the ILD layer afterwards. This simplifies the complexity of the fabrication process and reduces overall cost substantially.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
    providing a substrate;
    forming a first gate structure and a second gate structure on the substrate;
    forming a contact etch stop layer (CESL) on the first gate structure, the second gate structure, between the first gate structure and the second gate structure and on the substrate;
    removing part of the CESL between the first gate structure and the second gate structure to form a first CESL adjacent to the first gate structure and a second CESL adjacent to a first sidewall of the second gate structure, wherein the first CESL comprises a L-shape and the second CESL comprises a reverse L-shape;
    forming an interlayer dielectric (ILD) layer on and contacting the substrate and the CESL after forming the first CESL comprising the L-shape and the second CESL comprising the reverse L-shape; and
    forming a contact plug adjacent to a second sidewall of the second gate structure and not forming another contact plug adjacent to the first sidewall of the second gate structure.

2. The method of claim 1, wherein the substrate comprises a fin-shaped structure thereon, the method further comprises:
    forming the first gate structure and the second gate structure and at the same time forming a third gate structure on the substrate;
    forming a first spacer and a second spacer adjacent to each of the first gate structure, the second gate structure, and the third gate structure;
    forming the CESL, wherein the step of forming the CESL further comprises forming the CESL on the third gate structure and between the second gate structure and the third gate structure;
    removing part of the CESL between the first gate structure and the second gate structure and at the same time removing part of the CESL between the second gate structure and the third gate structure; and
    forming the interlayer dielectric (ILD) layer on the CESL, wherein the step of forming the ILD layer further comprises forming the ILD layer between the first gate structure, the second gate structure, and the third gate structure.

3. The method of claim 2, wherein the first spacer comprises SiCN and the second spacer comprises SiO$_2$.

4. The method of claim 2, wherein the step of forming the ILD layer further comprising forming the ILD layer to contact the fin-shaped structure.

5. The method of claim 2, further comprising:
    performing a replacement metal gate (RMG) process to transform the first gate structure, the second gate structure, and the third gate structure into a first metal gate, a second metal gate, and a third metal gate;
    forming a dielectric layer on the first metal gate, the second metal gate, the third metal gate, and the ILD layer; and
    forming the contact plug in the dielectric layer and the ILD layer and between the second metal gate and the third metal gate.

6. The method of claim 1, wherein the CESL comprises SiCN.

7. A semiconductor device, comprising:
    a substrate;
    a first gate structure and a second gate structure on the substrate;
    a first contact etch stop layer (CESL) adjacent to a sidewall of the first gate structure and a second CESL adjacent to a first sidewall of the second gate structure, wherein the first CESL comprises a L-shape, the second CESL comprises a reverse L-shape, and the bottom surfaces of the L-shape and the reverse L-shape are coplanar;
    an interlayer dielectric (ILD) layer on the substrate and contacting the CESL and the substrate between the first CESL and the second CESL; and a contact plug adjacent to a second sidewall of the second gate structure and no contact plug is adjacent to the first sidewall of the second gate structure.

8. The semiconductor device of claim 7, wherein the substrate comprises a fin-shaped structure thereon, the semiconductor device further comprises:
a first spacer and a second spacer adjacent to each of the first gate structure and the second gate structure.

9. The semiconductor device of claim 8, wherein the first spacer and the second spacer are I-shaped.

10. The semiconductor device of claim 8, wherein the first spacer comprises SiCN and the second spacer comprises $SiO_2$.

11. The semiconductor device of claim 7, wherein the first CESL and the second CESL comprise SiCN.

12. The semiconductor device of claim 7, wherein the interlayer dielectric (ILD) layer is between the first CESL and the second CESL.

13. The semiconductor device of claim 8, wherein the ILD layer contacts the first CESL, the second CESL, and the fin-shaped structure.

14. The semiconductor device of claim 8, wherein the top surfaces of the first spacer, the second spacer, the first CESL, the second CESL, and the ILD layer are coplanar.

15. The semiconductor device of claim 8, wherein the bottom surfaces of the first spacer, the second spacer, the first CESL, the second CESL, and the ILD layer are coplanar.

* * * * *